(12) United States Patent
McMillan et al.

(10) Patent No.: US 7,783,116 B2
(45) Date of Patent: Aug. 24, 2010

(54) WAVELET COMPRESSION

(75) Inventors: Alison J McMillan, Uttoxeter (GB); Graham Watson, Derby (GB)

(73) Assignee: Rolls-Royce plc, London (GB)

( * ) Notice: Subject to any disclaimer, the term of this patent is extended or adjusted under 35 U.S.C. 154(b) by 1080 days.

(21) Appl. No.: 10/720,344

(22) Filed: Nov. 25, 2003

(65) Prior Publication Data

US 2004/0105588 A1  Jun. 3, 2004

(30) Foreign Application Priority Data

Nov. 28, 2002  (GB) ................................ 0227743.2

(51) Int. Cl.
*G06K 9/36* (2006.01)
(52) U.S. Cl. .................................................. 382/232
(58) Field of Classification Search ................. 382/232
See application file for complete search history.

(56) References Cited

U.S. PATENT DOCUMENTS

| 5,490,221 | A | * | 2/1996 | Ransford et al. ............. 382/130 |
| 5,640,462 | A | * | 6/1997 | Sato et al. .................... 382/131 |
| 5,949,910 | A | * | 9/1999 | Go ................................ 382/233 |
| 5,991,515 | A | * | 11/1999 | Fall et al. ..................... 358/1.15 |
| 6,499,350 | B1 | * | 12/2002 | Board et al. ................... 73/660 |
| 6,801,665 | B1 | * | 10/2004 | Atsumi et al. ................ 382/239 |
| 2001/0016061 | A1 | * | 8/2001 | Shimoda et al. .............. 382/149 |
| 2001/0040997 | A1 | * | 11/2001 | Tsap et al. .................... 382/154 |
| 2002/0196848 | A1 | * | 12/2002 | Roman .................. 375/240.08 |

FOREIGN PATENT DOCUMENTS

| JP | 60180389 A | 2/1984 |
| WO | WO9949412 A | 9/1999 |

* cited by examiner

*Primary Examiner*—Vu Le
*Assistant Examiner*—Alex Liew
(74) *Attorney, Agent, or Firm*—Jeffrey S. Melcher; Manelli Denison & Selter PLLC

(57) ABSTRACT

A computer system programmed to process a large data set includes means for analysing the data set. The means for analysing the data set typically comprises a means for finite element analysis. The computer system also includes means for applying a data compression technique to the analysed data set such that the compressed analysed data set has high fidelity in regions of interest and has lower fidelity in regions of lesser interest. The data compression technique comprises the use of a wavelet compression technique. The computer system comprises a high specification server and a local workstation. This compressed analysed data set is easily managed by the local workstation to produce different cross-sectional displays without reusing the high capability server. The analysed data set for example comprises a 4D data set of a fan blade containment analysis of a casing.

4 Claims, No Drawings

WAVELET COMPRESSION

The present invention relates to a method of compressing data.

FIELD OF THE INVENTION

In particular it concerns a method for speeding up the operation of a computer set a task of processing the data without sacrificing the fidelity of the data in regions of special interest.

BACKGROUND OF THE INVENTION

In modern computational mechanics, typically, but not exclusively using Finite Element techniques, solution parameters are tabulated for discrete points in the problem domain. A typical large dynamic analysis may have a complex 3D geometry modelled with a million, elements, with results tabulated over a large number of time steps, thus creating a large four dimensional (4D) data set.

Consider for example, the problem of visualising a fan blade containment analysis of a large fan gas turbine engine. From an enormous 4D data set, a stress engineer must select appropriate cross-sections in order to visualise the most significant features as they change over the selected time frame. The choice of such cross-sections is usually subjective, based on experience and engineering intuition. However in models of very complex components which are subject to a range of loading conditions, it may be impossible to be certain that all the significant regions of the stress field have been inspected. Typically, the computer used to perform the calculations required for the analysis of the data set will be based around a high specification server, and only the graphical information needed for each individual view will be pushed down a network to an engineer's local machine.

The analysis of the data set is performed on a high specification multi processor machine, whereas the engineer performs post-processing on a local machine. The vast quantities of output analysed data supplied by the high specification server to the local machine are difficult to manage for the local machine so that in some cases it is necessary to view a subset of the output analysed data on the display of the local machine. In order to present a slightly different view of the model, or to present a section through the model, requires the high specification server to perform further processing in order for the new image to be shown on the display of the local machine. Thus it is difficult to show time-step or through model movies in real time. The processing may be performed on the remote high specification machine, but this is not an ideal situation, because interactive demands have a negative impact on the efficiency of the high specification machine for its other batch jobs.

However, there are three practical disadvantages to this technique:
  the graphical computation can be time consuming wherein each cross-section through the model can take several minutes to load,
  selection of views is by trial and error, and
  interactive demands on the server interfere with its performance on the other large finite element analyses, which it is processing.

For the purpose of exploring the solution domain, faster computer response is desirable. Although this would seem to indicate that a computer system with improved server capability would provide the solution, in practice the better the server, the more complex will be the Finite Element Analyses submitted to it. That is the number and complexity of the problems submitted to the machine for analysis will expand to fill the available capacity. The result is often no improvement at all.

SUMMARY OF THE INVENTION

The present invention seeks to provide a real solution to this problem by implementing a process the effect of which is to spare the server from interactive demands, and make better use of the graphics capabilities of the local machines. A key feature underlying the invention is selective use of a lower fidelity model to process the data set for regions of the model where reduced resolution is acceptable, and the graphical display of a model of sufficiently reduced size could be managed by the local workstation.

Accordingly the present invention provides a computer system programmed to process a large data set including means for analysing the data set and means for applying a data compression technique to the analysed data set such that the compressed analysed data set has high fidelity in regions of interest and has lower fidelity in regions of lesser interest.

Preferably the data compression technique comprises the use of a wavelet compression technique.

Preferably the data compression technique produces high fidelity in geometric regions of interest at points in time of interest.

Preferably the geometric region has a rapid change in the stress field or has a high deformation rate.

Preferably the analysed data set comprises a 4D data set.

Preferably the analysed data set comprises an analysed data set of a fan blade containment analysis of a casing.

Preferably the means for analysing the data set comprises a means for finite element analysis.

Preferably the computer system comprises a local workstation and a graphical display is produced at the location workstation.

The present invention also provides a method for processing a large data set comprising analysing the data set and applying a data compression technique to the analysed data set such that the compressed analysed data set has high fidelity in regions of interest and has lower fidelity in regions of lesser interest.

Preferably the data compression technique comprises using a wavelet compression technique.

Preferably the data compression technique produces high fidelity in geometric regions of interest at points in time of interest.

Preferably the geometric region has a rapid change in the stress field or has a high deformation rate.

Preferably the analysed data set comprises a 4D data set.

Preferably the analysed data set comprises an analysed data set of a fan blade containment analysis of a casing.

Preferably the analysing of the data set comprises finite element analysis.

Preferably the method comprises producing a graphical display at a local workstation.

The present invention also provides a computer system programmed to process a large data set including means for applying a data compression technique to the data set and means for analysing the compressed data set such that the analysis has high fidelity in regions of interest and has lower fidelity in regions of lesser interest.

The present invention further provides a method for processing large data sets comprising applying a data compression technique to the data set and analysing the compressed data set such that the analysis has high fidelity in regions of interest and has lower fidelity in regions of lesser interest.

DETAILED DESCRIPTION OF THE INVENTION

In computational modelling, for example computational mechanics, mathematical expressions, e.g. differential equations, are solved using finite element analysis, computational fluid dynamics, partial difference, boundary integral method, or other techniques to produce a solution given as a set of points within a problem domain. Thus the computer system, high specification server, is programmed to perform engineering numerical analysis, e.g. finite element analysis (FEA), computational fluid dynamics (CFD), partial difference, boundary integral method, etc, to generate solutions to mathematically posed problems on a set of points in the domain of the problem and the solution is a set of points within the problem domain, this is the analysed data set. The solution is usually arranged in a grid or finite element mesh.

The gridded, or meshed, analysed data set is treated like an image, which is normally in 4D for geometric features modelled over time, but may be more than 4D.

The high specification server performs an additional step as part of the batch processing of the analysis. In this final step, the high specification server creates a substantially compressed version of the analysed data set, which can be rapidly processed by the local machine.

The gridded, or meshed, analysed data set is then simplified by data compression by applying wavelet compression techniques to the gridded, or meshed, analysed data set. Thus the wavelet compression technique provides a compressed analysed data set, which has high fidelity in the regions of interest and has lower fidelity in the regions of lesser interest. This compressed analysed data set is then sent to one or more local workstations where the compressed analysed data set is viewed on a display by an engineer. The compressed analysed data set is more easily manipulated by the workstation to produce different cross-sections views without using the high capability server.

The most significant cross-sectional views are presented automatically to the engineer by selecting the regions which have the most rapid changes in the stress field, the highest stress field, the highest deformation rates or other variables of interest by selecting stress, deformation rate or other variables above a threshold, or by using principal component analysis of the analysis data set or Kriging.

Wavelets have been used with great success for 2D (two dimensional) image compression, with compressions to 5% of original data still giving visually acceptable images. Thus it may be expected that for 4D (four dimensional) compression, a reduced model of 0.25% of the original size is practical. The wavelets method of compression has the advantage over other methods of image compression in that sharp contrasts are preserved. It is therefore expected that areas which would be of interest to a stress engineer, for example rapid changes in the stress field, high deformation rates, etc, would be preserved in high fidelity. The fidelity of the less interesting regions of the model would be sacrificed. For example, in a fan blade containment analysis, most of the casing is not in the direct line of impact, and much of it experiences very little stress in comparison with the impact sites.

The region of interest is usually the region where the impact takes place, the rest of the geometry is necessary to provide the appropriate compliance of the impact region, but the stress data generated in the regions away from the impact region is usually of little consequence, with the particular exceptions of regions at boundaries or interfaces, for example mounting lugs and bolts.

This feature of wavelets may be further harnessed, to give a basis on which some of the most significant cross-sectional views may be automatically computed and presented to the engineer at the beginning of the post-processing stage.

The wavelet transform is extremely well suited to describing transient signals. The wavelet transform analyses in terms of scale, and employs scaled and translated combinations of a so-called 'mother' or analysing wavelet. The mother (and derived daughter) wavelets have compact support, that is they are of limited duration or spatial extent, and have zero mean. Wavelets exhibit the desirable property of being well localised not only in time, but also in frequency (or more precisely characteristic scale). May different forms of wavelet may be selected. Differing families of wavelets may be selected on the basis of the trade-off between a compact localisation in space and the smoothness of the function. The simplest wavelet is the Haar family, which essentially consists of scaled square step functions. The Coiflet family resemble derivative-of-Gaussian functions. The commonly-used Daubechies family possess fractal characteristics. All are governed by strict constraints, which guarantee sensible mathematical behaviour.

The choice of wavelet type is likely to influence the ratio between the fidelity levels in the region of interest of the data set and the fidelity levels in the less interesting region of the data set. The choice of wavelet enables the high fidelity region of interest to be kept above a controlled threshold and to minimise the data set required or to have a more faithful representation of the less interesting regions.

In an example data was developed from an analytical expression sampled over 128×128 data points. The analytical expression is summation of three Gaussian distributions in 2D:

$$\int (x, y) = \sum_{i=1}^{3} \exp[\psi_i (x - a_i)^2 - \phi_i (y - b_i)^2]$$

where $a_1=0.1$, $a_2=0.3$, $a_3=0.8$, $b_1=0.4$, $b_2=0.6$, $b_3=0.7$, $\psi_1=50$, $\psi_2=1000$, $\psi_3=10$, $\phi_1=200$, $\phi_2=30$, $\phi_3=200$. The domain was defined as $0 \leq x \leq 1$ and $0 \leq y \leq 1$. In this example levels of compression of 90%, 95%, 99%, 99.5% and 99.8% were achieved using 2D wavelet compression, using the Coiflet family of wavelets.

A reduction to 0.25% is also appropriate for analysis, and for post-processing, so that analysis times may be expected to be reduced to 0.000625% of the uncompressed original processing time. Corresponding reductions in the processing times of much bigger analyses may be contemplated. This is not likely unless there is a lot of degeneracy in the problem.

In an alternative technique wavelets are used to transform mathematical expressions, e.g. differential equations, such that the variables are then variables in wavelet space rather than variables in original space, i.e. physical variables in physical space e.g. stress, deformation rates etc. (Wavelet families are constructed such that they can be used for Hilbert transformations).

Computational algebra techniques are used to transform the problem to wavelet space, and the equations would be written in the form of one or more series of mathematical expressions involving wavelet functions summed to infinity (at this point the equations would be exact, with no compression).

The problem thus constructed in wavelet space is then truncated, so that it is given in terms of a finite number of wavelet terms. (This is what wavelet compression means).

This truncated expression is then recast in a form which is appropriate to finite element analysis techniques (or other appropriate techniques) using computational algebra, because the equations would be too complex to manage by hand.

The finite element solver is then run to obtain the results to the problem, in terms of wavelet space variables.

Then the solution in wavelet space is transferred back to original variables in original space e.g. physical variables in physical space.

In this case, the analysis data set would be similar to that described above, and similar methods could be used to display the results.

Application of wavelet compression to the problem prior to analysis, allows the finite element analysis solution to take place in high fidelity on the most significant geometric locations at the most significant points in time, while simultaneously reducing the fidelity elsewhere in the model. For example, in a fan blade containment analysis, most of the casing is not in the direct line of impact, and much of it experiences very little stress in comparison with the impact sites.

A reduction to 0.25% is also appropriate for analysis, and for post-processing, so that analysis times may be expected to be reduced to 0.000625% of the uncompressed original processing time. Corresponding reductions in the processing times of much bigger analyses may be contemplated. This could mean that pre-processing time, ie man-hours spent constructing the finite element mesh, could be reduced.

We claim:

1. A computer system programmed to process a large data set includes means for analyzing the data set, the means for analyzing the data set comprises means for solving mathematical expressions to produce an analyzed data set comprising a set of points within a problem domain, and means for applying a data compression technique to the analyzed data set such that the compressed analyzed data set has high fidelity in regions of interest and has lower fidelity in regions of lesser interest, the data compression technique produces high fidelity in geometric regions of interest at points in time of interest, the geometric region has at least one of a stress field and a deformation rate and the geometric region has at least one of a rapid change in the stress field, a high stress field or a high deformation rate, the computer system comprises a local workstation and a graphical display, and the computer has means to automatically present the most significant cross-sectional views on the graphical display, the means to automatically present the most significant cross-sectional views automatically selects regions which have at least one of a stress, a deformation rate or other variable above a threshold.

2. A method for processing a large data set representing a geometry, the method comprising:

analyzing the data set on a computer system, the analyzing of the data set comprising solving mathematical expressions to produce an analyzed data set comprising a set of points within a problem domain, and applying a data compression technique to the analyzed data set such that the compressed analyzed data set has high fidelity in regions of interest and has lower fidelity in regions of lesser interest, the data compression technique produces high fidelity in geometric regions of interest at points in time of interest, the geometric region has at least one of a stress field and a deformation rate and the geometric region has at least one of a rapid change in the stress field, a high stress field or a high deformation rate;

producing a graphical display at a local workstation; and automatically presenting the most significant cross-sectional views of the geometry on the graphical display, the automatic presentation of the most significant cross-sectional views of the geometry comprising automatically selecting regions which have at least one of a stress, a deformation rate or other variable above a threshold.

3. A computer system programmed to process a large data set includes means for applying a data compression technique to the data set and means for analyzing the data set such that the analysis has high fidelity regions of interest and has lower fidelity in regions of lesser interest, the data compression technique allows the analysis to take place in high fidelity in geometric regions of interest at points in time of interest, the geometric region has at least one of a stress field and a deformation rate and the geometric region has at least one of a rapid change in the stress field, a high stress field or a high deformation rate, the computer system comprises a local workstation and a graphical display, and the computer has means to automatically present the most significant cross-sectional views on the graphical display, the means to automatically present the most significant cross-sectional views automatically selects regions which have at least one of a stress, a deformation rate or other variable above a threshold.

4. A method for processing a large data set representing a geometry, the method comprising:

applying a data compression technique to the data set;

analyzing the compressed data set on a computer system such that the analysis has high fidelity in regions of interest and has lower fidelity in regions of lesser interest, the data compression technique allows the analysis to take place in high fidelity in geometric regions of interest at points in time of interest, the geometric region has at least one of a stress field and a deformation rate and the geometric region has at least one of a rapid change in the stress field, a high stress field or a high deformation rate;

producing a graphical display at a local workstation; and automatically presenting the most significant cross-sectional views of the geometry on the graphical display, the automatic presentation of the most significant cross-sectional views of the geometry comprising automatically selecting regions which have at least one of a stress, a deformation rate or other variable above a threshold.

* * * * *